United States Patent
Ottersbach et al.

(10) Patent No.: US 12,399,143 B2
(45) Date of Patent: Aug. 26, 2025

(54) TEMPERATURE-COMPENSATED DIELECTRIC-CONSTANT MEASURING DEVICE

(71) Applicant: Endress+Hauser SE+Co. KG, Maulburg (DE)

(72) Inventors: Pablo Ottersbach, Essen (DE); Thomas Blödt, Steinen (DE)

(73) Assignee: ENDRESS+HAUSER SE+CO. KG, Maulburg (DE)

( * ) Notice: Subject to any disclaimer, the term of this patent is extended or adjusted under 35 U.S.C. 154(b) by 236 days.

(21) Appl. No.: 18/040,988

(22) PCT Filed: Jul. 22, 2021

(86) PCT No.: PCT/EP2021/070505
§ 371 (c)(1),
(2) Date: Feb. 8, 2023

(87) PCT Pub. No.: WO2022/033829
PCT Pub. Date: Feb. 17, 2022

(65) Prior Publication Data
US 2023/0304955 A1    Sep. 28, 2023

(30) Foreign Application Priority Data
Aug. 11, 2020 (DE) ...................... 10 2020 121 151.1

(51) Int. Cl.
*G01N 27/22*     (2006.01)
*G01R 1/067*     (2006.01)

(52) U.S. Cl.
CPC ....... *G01N 27/221* (2013.01); *G01R 1/06711* (2013.01); *G01R 1/06772* (2013.01)

(58) Field of Classification Search
CPC .............. G01N 27/221; G01R 1/06711; G01R 1/06722
See application file for complete search history.

(56) References Cited

U.S. PATENT DOCUMENTS 3,739,265 A * 6/1973 Skildum .............. G01N 27/223
                                                      324/687
3,938,385 A * 2/1976 Horwath ................ G01K 1/026
                                                      374/E7.038
(Continued)

FOREIGN PATENT DOCUMENTS

CH             628735 A      3/1982
CN         102680521 A       9/2012
(Continued)

OTHER PUBLICATIONS

Translation of DE 102016213324 B3 (Year: 2017).*

*Primary Examiner* — Paresh Patel
(74) *Attorney, Agent, or Firm* — Brannon Sowers & Cracraft PC

(57) ABSTRACT

A high-frequency-based measuring device for determining a temperature-compensated dielectric constant of a medium includes a measuring probe having an electrically conductive inner conductor and an outer conductor. The inner conductor is rod-like along an axis. The inner wall of the outer conductor is symmetrical about the axis of the inner conductor and expands along the axis toward the medium. The measuring device includes a temperature sensor located in a first end region of the inner conductor, toward which end region the inner wall of the outer conductor expands. One of the temperature sensor terminals is at the potential of the inner conductor. The temperature of the medium is measured directly, without impairment of the high-frequency-based measurement of the dielectric constant. A highly accurate measurement of the dielectric constant and highly accurate temperature compensation are thereby made possible.

9 Claims, 2 Drawing Sheets

(56) References Cited

U.S. PATENT DOCUMENTS

| | | | | | |
|---|---|---|---|---|---|
| 4,135,397 | A | * | 1/1979 | Krake | G01F 23/284 |
| | | | | | 73/304 R |
| 4,786,857 | A | * | 11/1988 | Mohr | G01F 23/268 |
| | | | | | 73/304 R |
| 4,841,988 | A | * | 6/1989 | Fetter | A61B 18/18 |
| | | | | | 219/712 |
| 6,459,995 | B1 | * | 10/2002 | Collister | G01N 33/2888 |
| | | | | | 73/304 C |
| 2009/0212789 | A1 | | 8/2009 | Lin et al. | |
| 2015/0123688 | A1 | | 5/2015 | Sappok et al. | |

FOREIGN PATENT DOCUMENTS

| | | | |
|---|---|---|---|
| DE | 19917618 | A1 | 5/2000 |
| DE | 202013102514 | U1 | 6/2013 |
| DE | 102012104075 | A1 | 11/2013 |
| DE | 102016113917 | A1 | 2/2017 |
| DE | 102016213324 | B3 * | 8/2017 |
| EP | 1331476 | A1 | 7/2003 |

* cited by examiner

TEMPERATURE-COMPENSATED DIELECTRIC-CONSTANT MEASURING DEVICE

CROSS-REFERENCE TO RELATED APPLICATIONS

The present application is related to and claims the priority benefit of DPMA Patent Application No. 10 2020 121 151.1, filed on Aug. 11, 2020, and International Patent Application No. PCT/EP2021/070505, filed on Jul. 22, 2021, the entire contents of which are incorporated herein by reference.

TECHNICAL FIELD

The invention relates to a measuring device for determining a temperature-compensated dielectric constant of a medium.

BACKGROUND

In automation technology, especially for process automation, field devices are often used, which serve to detect various measured variables. The measured variable may, for example, be a fill level, a flow, a pressure, the temperature, the pH value, the redox potential, a conductivity, or the dielectric constant of a medium in a process plant. In order to detect the corresponding measured values, the field devices respectively comprise suitable sensors or are based on suitable measuring methods. A variety of different types of field devices are produced and marketed by the Endress+Hauser group of companies.

The determination of the dielectric constant (also known as "specific inductive capacity" or "relative permittivity") of diverse media is of great interest both for solids and for liquid and gaseous charges, such as fuels, wastewater, gases, gas phases, or chemicals, since this constant can be a reliable indicator of contaminants, the moisture content, the material concentration, or the material composition. Possible measuring principles for determining the dielectric constant are to measure the amplitude, the phase shift, or the signal transit time of high-frequency signals. A high-frequency signal with a defined frequency or within a defined frequency band is hereby coupled into the medium, and a corresponding received signal is evaluated with respect to its amplitude, phase position, or signal transit time in relation to the emitted high-frequency signal. The term "high-frequency signal" in the context of this patent application relates to corresponding signals with frequencies between 10 MHz and 100 GHz.

For example, a phase-based dielectric-constant measuring device is described in the published document DE 10 2017 130728 A1. In this case, the effect is utilized that the signal speed of the high-frequency signal, and thus the phase position along a measuring probe, depends on the dielectric constant of the medium that prevails along the measuring probe. In principle, a distinction is made between a relative and an absolute phase measurement, wherein, in the case of an absolute phase measurement, a so-called quadrant correction is additionally performed.

The TDR ("Time Domain Reflectometry") principle may, for example, be applied to determine the dielectric constant by means of pulse transit-time measurement. In this measuring principle, the sensor transmits a pulsed high-frequency signal with a frequency of between 0.1 GHz and 150 GHz along an electrically conductive measuring probe and measures the transit time of the pulse until the reflected high-frequency signal is received. Here, the effect is utilized that the pulse transit time is dependent on the dielectric constant of the substance that surrounds the measuring probe. The functional principle of TDR sensors is described in the publication document EP 0622 628 A2, for example. TDR sensors are sold in numerous embodiments by the company IMKO Micromodultechnik GmbH, for example. Moreover, TDR sensors are advantageous in that, in addition to the dielectric constant, the dielectric loss factor of the substance can potentially also be determined.

In process automation, the dielectric constant is often to be determined in applications which do not run at room temperature, such as moisture measurement in the food industry. However, since the dielectric constant is strongly temperature-dependent, most of all in the case of water-containing media, the dielectric-constant measurement therefore requires a temperature compensation depending on the application. In particular, in order to be able to determine the moisture content of a medium via the dielectric constant, an extremely precise and reproducible temperature measurement is therefore required. An adequate temperature measurement at the medium is, however, normally not possible since an integration of the temperature sensor into the dielectric-constant measuring device is difficult to realize in practice: Insofar as the temperature sensor is integrated directly into the measuring probe of the dielectric-constant measuring device, and thus at the location of the medium to be examined, this significantly distorts the dielectric-constant measurement at least in the case of high-frequency-based measuring devices. However, a realization of the temperature sensor away from the measuring probe can in turn have the result that, for example, the external temperature at the container in which the medium is located is measured and not the temperature of the medium to be examined.

SUMMARY

The invention is therefore based on the object of providing a measuring device for determining the dielectric constant, by means of which measuring device the dielectric constant can be measured and temperature-compensated as accurately as possible.

The invention achieves this object via a measuring device for determining a temperature-compensated dielectric constant of a medium, which measuring device comprises the following components:

a measuring probe with:
  an electrically conductive inner conductor which is rod-like at least in a portion along an axis,
  an outer conductor which is arranged around the inner conductor and comprises at least one electrically conductive inner wall, wherein the inner wall is symmetrical about the axis such that the inner wall expands along the axis,
a temperature sensor,
  which is located in a first end region of the inner conductor, toward which end region the inner wall of the outer conductor expands, and
  which comprises at least two electrical terminals, wherein the first terminal is at the potential of the inner conductor.

The measuring probe is designed such that the first end region of the inner conductor, in which the temperature sensor is located or toward which the outer conductor expands, is oriented toward the medium in the installed state of the measuring device.

In order to control the measuring probe, the measuring device comprises:
 a control/evaluation unit, which is designed
  to determine the temperature of the medium via the second terminal of the temperature sensor,
  to couple a high-frequency electrical signal into the inner conductor or the outer conductor and to receive a corresponding received signal, and
  to determine, using the determined temperature and using the received signal, the dielectric constant of the medium in a temperature-compensated manner.

The measuring device according to the invention thus, on the one hand, makes use of the fact that the location of the temperature measurement coincides with the location of the dielectric-constant measurement. On the other hand, the realization according to the invention is used, that the high-frequency-based dielectric-constant measurement is not influenced insofar as the temperature sensor is at the potential of the inner conductor on one side. For this purpose, the temperature sensor can, for example, be designed as a capacitive sensor or as a resistance-based sensor, in particular as a PT1000. Both a precise dielectric-constant measurement and a precise temperature compensation of the dielectric-constant measurement can thereby be achieved.

Within the scope of the invention, the term "unit" in principle refers to any electronic circuit that is designed in a manner suitable for the intended purpose. Depending on the requirement, it may therefore be an analog circuit for generating or processing corresponding analog signals. However, it may also be a digital circuit, such as an FPGA, or a storage medium in interaction with a program. In this case, the program is designed to perform the corresponding method steps or to apply the necessary calculation operations of the respective unit. In this context, various electronic units of the dielectric-constant measuring device in the sense of the invention can potentially also access a common physical memory or be operated by means of the same physical digital circuit.

Within the scope of the invention, it is not relevant which high-frequency-based measuring principle is implemented in the measuring device in order to determine the dielectric constant. For example, the measuring device or the control/evaluation unit may be designed to determine the dielectric constant of the medium using a phase position, using an amplitude, and/or using a transit time, in particular a group transit time or a phase transit time, of the received signal. However, the control/evaluation unit may also be designed accordingly in order to determine the dielectric constant of the medium by means of a pulse transit-time method, in particular by means of the TDR method or the FMCW method.

The frequency of the high-frequency signal is in principle to be selected as a function of the dielectric-constant measurement range. In the case of a measurement range of the dielectric constant between 1 and 140 (includes, in addition to aqueous media, gases with 1 to 1.5 and oily measuring media with 2 to 20), the control/evaluation unit is to be designed accordingly in order to generate the high-frequency electrical signal with a frequency between 0.1 GHz and 30 GHz. In the case of aqueous media whose dielectric constant is approximately 80 to 100, the high-frequency signal is preferably to be generated and evaluated correspondingly with a frequency of between 5 GHz and 8 GHz.

The length of the inner conductor and the geometry of the outer conductor are to be designed in this regard as a function of the frequency of the high-frequency signal. The inner wall of the outer conductor can, for example, be formed symmetrically about the axis such that it expands conically, exponentially, or elliptically along the axis in order to direct the near field of the high-frequency signal toward the medium. So that the propagation of the field toward the medium is optimally not influenced, the inner conductor and/or the second terminal of the temperature sensor can be contacted with the control/evaluation unit via a second end region of the inner conductor opposite the first end region of the inner conductor.

In order to be able to reduce the dimensions of the measuring probe without reducing the measurement accuracy, an electrically insulating filling can moreover be introduced between the inner conductor and the outer conductor. The higher the dielectric constant of the filling is, the smaller can the measuring probe be designed. Accordingly, it is advantageous if the filling has a dielectric constant of at least 2. Accordingly, polyethylene, PEEK, PTFE, or polypropylene can, for example, be cast as filling for this purpose.

Correspondingly to the dielectric-constant measuring device according to the invention, in accordance with one of the previously described embodiment variants, the object on which the invention is based is moreover achieved via a corresponding method for operating the measuring device. Accordingly, the method comprises at least the following method steps:
 coupling the high-frequency signal into the measuring probe,
 decoupling a corresponding received signal from the measuring probe,
 determining the dielectric constant using at least the received signal,
 measuring the temperature by means of the temperature sensor, and
 temperature compensation of the dielectric constant using the determined temperature.

The temperature compensation may be performed, for example, on the basis of a compensation function or using a look-up table. In this context, it is possible to create the compensation function or a look-up table by training or calibration of the measuring device on media with known dielectric constants and at known temperatures.

BRIEF DESCRIPTION OF THE DRAWINGS

The invention is explained in more detail with reference to the following figures. The following are shown.

DETAILED DESCRIPTION

Figure 1:
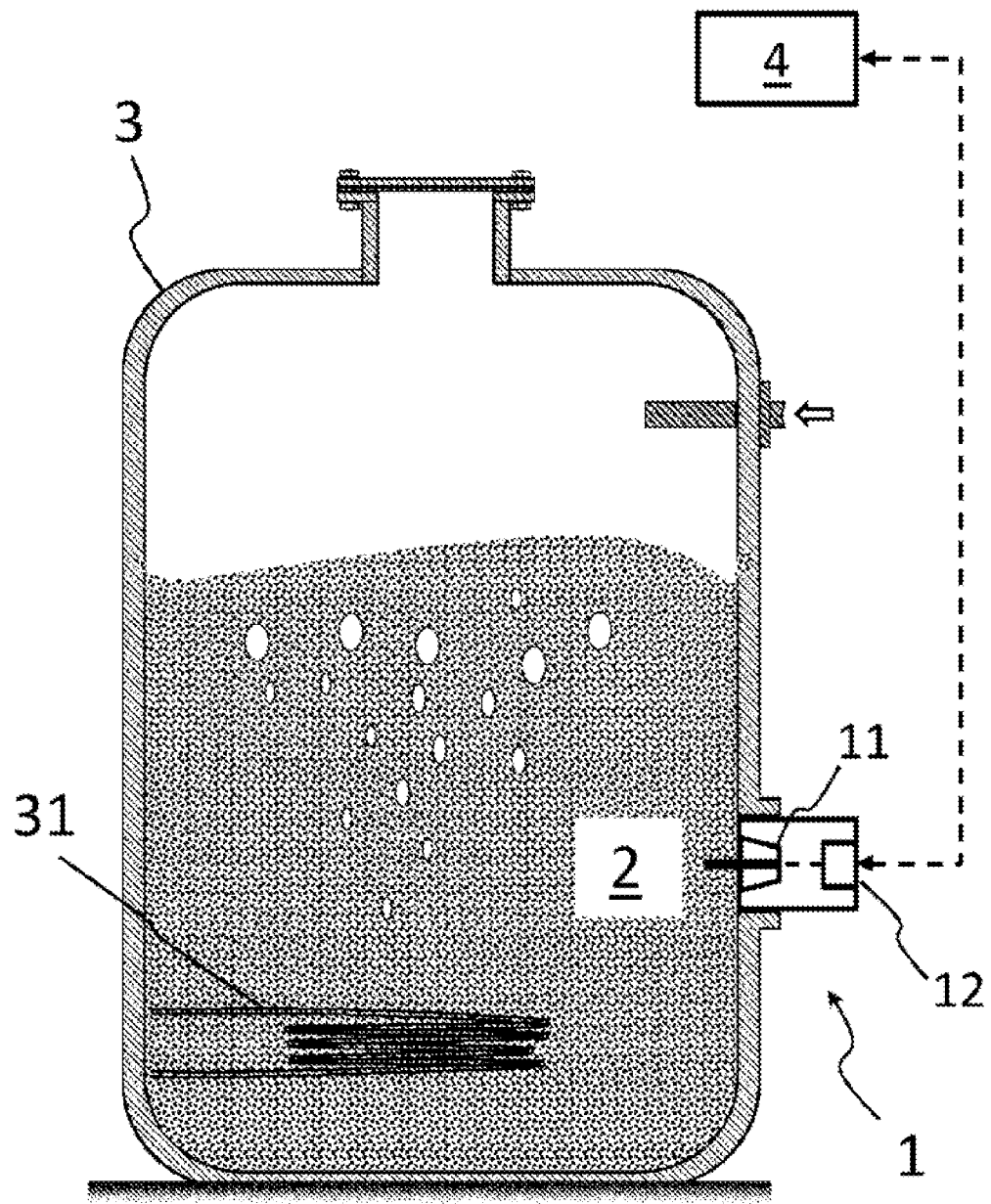
FIG. 1 shows a dielectric-constant measuring device according to the present disclosure, on a container.

For a general understanding of the dielectric-constant measuring device 1 according to the invention, a schematic arrangement of the measuring device 1 on a container 3 filled with a medium 2 is shown in FIG. 1: In order to determine the dielectric constant of the medium 2, the measuring device 1 is attached laterally to a terminal of the container 3, such as a flange terminal. Optionally, the measuring device 1 may be connected to a superordinate unit 4, such as a process control system. "PROFIBUS," "HART," or "wireless HART," for instance, may be implemented as an interface. The dielectric constant can thereby be transmitted as an absolute value or complex-valued with real part and imaginary part. However, other information about the general operating state of the measuring device 1 may also be communicated.

The medium 2 may be liquids, such as beverages, paints, cement, or fuels, such as liquid gases or mineral oils. However, the use of the measuring device 1 for bulk material-type media 2, such as grain to be dried, is also conceivable. Depending on the application, the medium 2 can also be subjected in the container 3 to exothermic reactions, such as fermentation processes, in addition to drying processes. For this purpose, the container 3 can optionally be appropriately climate-conditioned, for example by means of a heating element 31 located on the container 3. Accordingly, the temperature of the medium 2 can deviate from room temperature at least during the respective process. Since, depending on the medium 2, the dielectric constant is strongly temperature-dependent, the measuring device 1 must therefore be designed to determine the dielectric constant of the medium 2 in a temperature-compensated manner.

The measuring device 1 according to the invention, by means of which the dielectric constant can be determined in a temperature-compensated manner, is based on determining the dielectric constant by means of high-frequency signals $s_{HF}$, $r_{HF}$. For example, transit-time-based measuring principles, such as the TDR method or FMCW method, can be implemented as measuring principles for determining the dielectric constant. In addition, however, amplitude-based or phase-based measuring principles may also be implemented. So that the corresponding near field of the high-frequency signal $s_{HF}$ interacts with the medium 2 for the determination of the dielectric constant, the measuring device 1 therefore comprises a measuring probe 11 oriented toward the medium, as is schematically illustrated in FIG. 1. The measuring probe 11 is controlled by a control/evaluation unit 12 of the measuring device 1 in that a high-frequency electrical signal $s_{HF}$ is coupled into the measuring probe 11. The control/evaluation unit 12 can thus decouple a corresponding received signal $r_{HF}$ in order to determine, based thereon, the current, as yet not temperature-compensated dielectric constant of the medium 2.

Figure 2:
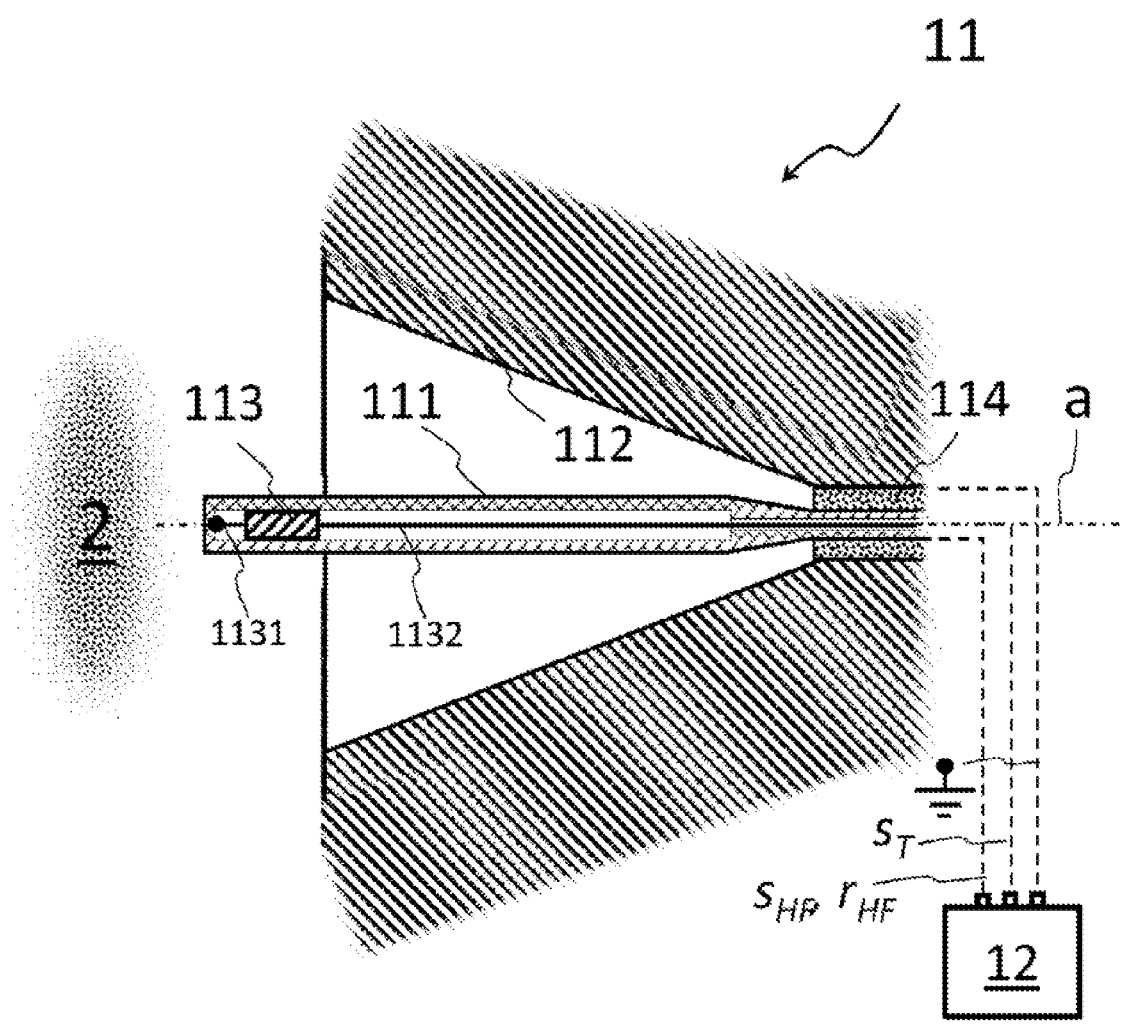
FIG. 2 shows a cross-sectional view of the measuring probe of the dielectric-constant measuring device.

The structure according to the invention of the measuring probe 11, by means of which a temperature compensation is enabled, is illustrated in more detail as a cross-sectional view in FIG. 2: The core of the measuring probe 11 is an electrically conductive inner conductor 111 and an outer conductor 112 arranged around the inner conductor 111. The control/evaluation unit 12 couples the high-frequency signal $s_{HF}$ into the two conductors 111, 112 in order to be able to decouple the corresponding received signal $r_{HF}$ after interaction with the medium 2. In principle, it is irrelevant which of the two conductors 111, 112 acts as a signal ground. From a functional point of view, it is moreover not relevant whether the inner conductor 111 and the outer conductor 112 are manufactured completely from an electrically conductive material. It is only necessary that the inner conductor 111 has an electrically conductive outer wall with respect to the outer conductor 112, and that the outer conductor 112 has an electrically conductive inner wall with respect to the inner conductor 111. However, since the medium 2 to be examined may also be hygienically sensitive substances, it is advantageous to manufacture at least the inner conductor 111 from stainless steel. Insofar as the outer conductor is not also made entirely of stainless steel, the inner wall of the outer conductor 112 can, for example, be metal-coated by means of sputtering or by means of a chemical vapor deposition method.

As emerges from FIG. 2, the inner conductor 111 is rod-like, wherein its cross section is preferably round. The rod forms a straight-line axis a which is oriented toward the medium 2 in the mounted state of the measuring device 1. Moreover, the axis a of the inner conductor 111 defines the geometry of the outer conductor 112 inasmuch as that the inner wall of the outer conductor 112 is symmetrical about the axis a such that the inner wall of the outer conductor 112 expands along the axis a toward the medium 2. In relation to the axis a, the inner wall of the outer conductor 112 is in turn preferably to be designed with a round cross section.

In the embodiment of the measuring probe 11 shown in FIG. 2, the expansion of the inner wall of the outer conductor 112 is conical. In general, the shape or the opening angle of the expansion is to be adapted to the dielectric constant range to be measured and the frequency of the high-frequency signal $s_{HF}$ such that the near field of the high-frequency signal $s_{HF}$ penetrates with maximum intensity into the medium 2. The sensitivity of the dielectric-constant measurement is thereby maximized. Accordingly, the inner wall of the outer conductor 112 may, for example, also be expanded elliptically or exponentially.

From the height of the axis a at which the expansion of the outer conductor inner wall originates, the two conductors 111, 112 are separated by an insulation 114. In the embodiment variant shown in FIG. 2, the electrical contacting of the two conductors 111, 112 with the control/evaluation unit 12 takes place via this end region. The insulation 114 can in this case be realized based on PTFE, for example. Via this cable guide or conductor guide, it is prevented that any cables within the interior are guided between the inner conductor 111 and the outer conductor 112 within the expansion, whereby the sensitivity of the dielectric-constant measurement is in turn maintained. Optionally, an electrically insulating filling with a dielectric constant greater than one, for example made of PEEK, may also be introduced in the interior between the inner conductor 111 and the outer conductor 112. The dimensions of the measuring probe 11 with respect to the length and the diameter of the outer conductor 112 can thereby be reduced without reducing the sensitivity of the dielectric-constant measurement.

For temperature compensation of the dielectric-constant measurement, a temperature sensor 113 is arranged in the end region of the rod-like inner conductor 111, said end region facing toward the medium 2. In the embodiment variant shown in FIG. 2, the inner conductor 111 or its end region facing toward the medium 2 protrudes beyond the outer conductor 112 in relation to the axis a. As a result, in the mounted state of the measuring device 1, the temperature sensor 113 projects beyond the container wall into the medium 2 so that the measurement of the current medium temperature is optimally not distorted by the container wall. In particular, the temperature measurement and the dielectric-constant measurement take place at the same location so that a medium temperature deviating from room temperature can be compensated directly in the control/evaluation unit 12 with respect to the dielectric constant.

The temperature sensor 113 can be designed as a capacitive sensor or as a resistance-based sensor, in particular as a PT1000. Within the scope of the invention, it is only essential that the temperature sensor 113 as shown in FIG. 2 has at least two electrical terminals 1131, 1132, since one of the two terminals 1131 is, according to the invention, connected to the potential of the inner conductor 111. As a technical effect, this most of all has the effect that only one terminal 1132 of the temperature sensor 113 must be guided out of the inner conductor 111. As a result, the diameter of the inner conductor 111 can be kept small so that the impedance matching at the second end region 114, for example with a 50-ohm coaxial cable, is simplified.

Via the other terminal 1132, the control evaluation unit 12 can determine the temperature directly at the location of the medium 2 by means of a corresponding evaluation signal $s_T$. Using the determined temperature and using the previously determined dielectric constant of the medium 2, it is thereby possible for the control/evaluation unit 12 to very precisely compensate said dielectric constant with respect to the temperature, for example to room temperature. The control/evaluation unit 112 can, for example, perform the temperature compensation in that it compares the measured dielectric constant and the measured temperature to a look-up table or a compensation function which, for example, is obtained via medium-specific calibration measurements.

In the exemplary embodiment of the measuring probe 11 as shown in FIG. 2, the terminal 1132 of the temperature sensor 113 by means of which the control/evaluation unit determines the temperature of the medium 2 is guided from the inner conductor 111, via the second end region 114, out of the measuring probe 11. The advantage of such a guiding of the terminal 1132, as compared to a guiding of this terminal 1132 via the interior between the inner conductor 111 and the outer conductor 112, is that the interior is not disturbed thereby in terms of high-frequency technology, so that the dielectric-constant measurement is not impaired. Contrary to the illustration in FIG. 2, a guiding of the second terminal 1132 out of the measuring probe 11 through the interior and then through the outer conductor 112 in turn offers the advantage of simplified manufacturability of the measuring probe 11.

The invention claimed is:

1. A measuring device for determining a temperature-compensated dielectric constant of a medium, comprising:
   a measuring probe including:
      an electrically conductive inner conductor which is rod-like at least in a portion along an axis;
      an outer conductor which is arranged around the inner conductor and includes an electrically conductive inner wall, wherein the inner wall is symmetrical about the axis such that the inner wall expands along the axis; and
      a temperature sensor located in a first end region of the inner conductor, wherein the temperature sensor includes at least two electrical terminals, wherein the first terminal is at the potential of the inner conductor,
   wherein the measuring probe is designed such that the first end region of the inner conductor in which the temperature sensor is located is oriented toward the medium in the installed state of said measuring device; and
   a control/evaluation unit configured to determine a temperature of the medium via the second terminal of the temperature sensor, to couple a high-frequency electrical signal into the inner conductor or the outer conductor and to receive a corresponding received signal, and to determine, using the determined temperature and using the received signal, the dielectric constant of the medium in a temperature-compensated manner;
   wherein the inner wall of the outer conductor expands toward the first end region of the inner conductor so as to direct the near field of the high-frequency signal toward the medium in the installed state of said measuring device.

2. The measuring device in accordance with claim 1, wherein the control/evaluation unit is further configured to determine the dielectric constant of the medium using a phase position, using an amplitude, and/or using a transit time, including a group transit time or a phase transit time, of the received signal.

3. The measuring device in accordance with claim 1, wherein the control/evaluation unit is further configured to determine the dielectric constant of the medium by means of a pulse transit-time method, including by a Time Domain Reflectometry (TDR) method or a frequency modulated continuous wave (FMCW) method.

4. The measuring device in accordance with claim 1, wherein the inner wall of the outer conductor is symmetrical about the axis such that it expands conically, exponentially, or elliptically along the axis.

5. The measuring device in accordance with claim 1, wherein the temperature sensor is realized as a capacitive sensor or as a resistance-based sensor.

6. The measuring device in accordance with claim 1, wherein the control/evaluation unit is further configured to generate and evaluate the high-frequency electrical signal with a frequency of between 0.1 GHz and 30 GHz.

7. The measuring device in accordance with claim 1, wherein the inner conductor and/or the second terminal of the temperature sensor is/are contacted with the control/evaluation unit via a second end region of the inner conductor opposite the first end region of the inner conductor.

8. The measuring device in accordance with claim 1, wherein an electrically insulating filling with a dielectric constant of greater than 2 is introduced between the inner conductor and the outer conductor.

9. A method for determining a temperature-compensated dielectric constant of a medium comprising:
   providing a measuring device for determining the temperature-compensated dielectric constant of the medium, including:
      a measuring probe including:
         an electrically conductive inner conductor which is rod-like at least in a portion along an axis;
         an outer conductor which is arranged around the inner conductor and includes an electrically conductive inner wall, wherein the inner wall is symmetrical about the axis such that the inner wall expands along the axis; and
         a temperature sensor located in a first end region of the inner conductor, toward which first end region the inner wall of the outer conductor expands, wherein the temperature sensor includes at least two electrical terminals, wherein the first terminal is at the potential of the inner conductor,
      wherein the measuring probe is designed such that the first end region of the inner conductor in which the temperature sensor is located is oriented toward the medium in the installed state of said measuring device; and
      a control/evaluation unit configured to determine a temperature of the medium via the second terminal of the temperature sensor, to couple a high-frequency electrical signal into the inner conductor or the outer conductor and to receive a corresponding received signal, and to determine, using the determined temperature and using the received signal, the dielectric constant of the medium in a temperature-compensated manner;
coupling the high-frequency signal into the measuring probe;
decoupling a corresponding received signal from the measuring probe;
determining the dielectric constant using at least the received signal;
measuring the temperature via the temperature sensor; and
compensating for temperature in the determined dielectric constant using the determined temperature;
directing the near field of the high-frequency signal toward the medium via the inner wall of the outer conductor.

* * * * *